(12) United States Patent
Hwang et al.

(10) Patent No.: US 7,745,284 B2
(45) Date of Patent: Jun. 29, 2010

(54) METHOD OF MANUFACTURING FLASH MEMORY DEVICE WITH CONDUCTIVE SPACERS

(75) Inventors: Joo Won Hwang, Seoul (KR); Byung Soo Park, Icheon-si (KR); Ga Hee Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 143 days.

(21) Appl. No.: 11/500,594

(22) Filed: Aug. 8, 2006

(65) Prior Publication Data

US 2007/0161187 A1  Jul. 12, 2007

(30) Foreign Application Priority Data

Dec. 28, 2005  (KR) ............... 10-2005-0131357
Dec. 28, 2005  (KR) ............... 10-2005-0131374

(51) Int. Cl.
*H01L 21/363* (2006.01)
(52) U.S. Cl. .................... 438/257; 257/E29.3
(58) Field of Classification Search ............ 438/257, 438/197, 142, 201; 257/315, E29.3, E29.304
See application file for complete search history.

(56) References Cited

U.S. PATENT DOCUMENTS

| | | | | |
|---|---|---|---|---|
| 6,200,839 | B1 * | 3/2001 | Batra et al. | 438/180 |
| 6,977,201 | B2 | 12/2005 | Jung | 438/263 |
| 6,979,619 | B1 | 12/2005 | Fang et al. | 438/258 |
| 2001/0029076 | A1 * | 10/2001 | Lin et al. | 438/257 |
| 2003/0071297 | A1 * | 4/2003 | Hara et al. | 257/298 |
| 2004/0197992 | A1 | 10/2004 | Yang | 438/257 |
| 2004/0266111 | A1 * | 12/2004 | Lee | 438/264 |
| 2005/0153520 | A1 * | 7/2005 | Lee et al. | 438/424 |
| 2006/0073666 | A1 * | 4/2006 | Lim et al. | 438/303 |
| 2006/0110942 | A1 * | 5/2006 | Lee | 438/786 |

FOREIGN PATENT DOCUMENTS

| | | |
|---|---|---|
| CN | 1571146 | 1/2005 |
| CN | 1577803 | 2/2005 |
| JP | 2003-124356 | 4/2003 |
| KR | 238865 | 10/1999 |
| KR | 10-20020006127 A | 1/2002 |
| KR | 2003/0056666 | 7/2003 |

(Continued)

OTHER PUBLICATIONS

Office action in corresponding Korean Patent Application No. 2005-131357, received Dec. 11, 2006.

(Continued)

*Primary Examiner*—Hsien-ming Lee
*Assistant Examiner*—Walter H Swanson
(74) *Attorney, Agent, or Firm*—Marshall, Gerstein & Borun LLP

(57) ABSTRACT

A method of manufacturing a flash memory device. According to the invention, a floating gate can be formed and a distance between cells can be secured sufficiently by using one conductive layer without using a SA-STI process that cannot be applied to the manufacturing process of highly integrated semiconductor devices. It is therefore possible to minimize interference between neighboring cells.

5 Claims, 6 Drawing Sheets

FOREIGN PATENT DOCUMENTS

| | | |
|---|---|---|
| KR | 1020030091781 | 12/2003 |
| KR | 1020030094940 | 12/2003 |
| KR | 10-20050002411 A | 1/2005 |
| KR | 2005/0069125 | 7/2005 |
| TW | 530414 | 5/2003 |
| TW | 1224858 | 12/2004 |
| TW | 200518282 | 6/2005 |
| TW | 200520165 | 6/2005 |

OTHER PUBLICATIONS

Official Office Action for Chinese Patent Application No. 2006101627966, dated May 16, 2008.

Translation of Notification for the Opinion of Examination for corresponding Taiwanese Patent Application No. 95124236, dated Sep. 23, 2008.

English-language translation of an Aug. 7, 2009, Chinese Patent Office action to counterpart Chinese patent application No. 200610162796.6.

* cited by examiner

METHOD OF MANUFACTURING FLASH MEMORY DEVICE WITH CONDUCTIVE SPACERS

BACKGROUND

1. Field of the Invention

The invention relates generally to semiconductor memory devices and, more particularly, to a method of manufacturing a flash memory device, in which an interference phenomenon between neighboring cells in high-integrated semiconductor devices can be minimized and the coupling ratio can be enhanced by controlling the effective field height (EFH) by etching an isolation film at a predetermined thickness.

2. Discussion of Related Art

A NAND flash memory device performs data program by injecting electrons into the floating gate by Fowler-Nordheim (FN) tunneling phenomenon, thereby proving a large capacity and a high degree of integration.

The NAND flash memory device includes a plurality of cell blocks. One cell block includes a plurality of cell strings in which a plurality of cells for storing data are in series connected to form one string, and a drain select transistor and a source select transistor formed between the cell string and the drain, and the cell string and the source, respectively.

The cell of the NAND flash memory device is formed by forming an isolation film on a semiconductor substrate, forming a gate in which a tunnel oxide film, a floating gate, a dielectric layer, and a control gate are stacked on the semiconductor substrate, and forming junction units on both sides of the gate. The isolation film and the floating gate are formed by a shallow trench isolation (STI), self-aligned shallow trench isolation (SA-STI), or self aligned floating gate (SAFG) process.

As the size of the NAND flash memory device decreases, however, the distance between the cells reduces and the operations of neighboring cells are influenced accordingly. As a result, the interference phenomenon between the neighboring cells whose states are changed becomes the most important problem. For example, upon programming, a threshold voltage of a program cell rises under the influence of the threshold voltages of neighboring cells due to the interference phenomenon between the neighboring cells. Accordingly, the distributions of the threshold voltage of the program cell are widely changed, resulting in failure of a chip. The interference problem between neighboring cells becomes more profound in multi-level cells. To minimize the interference phenomenon between the cells, the distance between the cells must be secured sufficiently. However, as the level of integration of devices is increased, to secure a sufficient distance between the cells has a limit.

Meanwhile, in the SA-STI process that is most widely used, a floating gate must be formed using first and second conductive layers and the second conductive layer must be patterned using the floating gate mask. However, as the level of integration of semiconductor devices is increased and the cell size decreases, the alignment margin is reduced. As a result, the process employing the floating gate mask is no longer used.

SUMMARY OF THE INVENTION

In one embodiment, the invention provides a method of manufacturing a flash memory device, in which a floating gate can be formed using one conductive layer without using the SA-STI process having a limit as the degree of integration of semiconductor devices is increased and an interference phenomenon between neighboring cells can be minimized by securing a sufficient distance between the cells.

In another embodiment, the invention provides a method of manufacturing a flash memory device, in which a floating gate can be formed without using the SA-STI process and a contact area with a dielectric film can be increased while minimizing an interference phenomenon between neighboring cells by securing a sufficient distance between the cells, thereby increasing the coupling ratio.

In another embodiment, the invention provides a method of manufacturing a flash memory device, in which the coupling ratio of a cell region can be increased by overcoming a problem in which the EFH is limitedly controlled due to a thickness of a gate oxide film of a high-voltage transistor region, which is thicker than that of a tunnel oxide film of the cell region.

In still another embodiment, the invention provides a method of manufacturing a flash memory device, in which it can prevent damage to a tunnel oxide film, a semiconductor substrate or a floating gate in a process of etching an isolation film at a predetermined thickness in order to increase the coupling ratio.

According to an aspect of the invention, a method of manufacturing a flash memory device includes the steps of (a) sequentially forming a tunnel oxide film and a first conductive layer on a semiconductor substrate of a first region, thus forming a floating gate pattern, and forming a trench type isolation film on the semiconductor substrate of a second region, (b) etching the isolation film at a predetermined thickness, and (c) sequentially forming a dielectric film and a second conductive layer on the entire structure and patterning the second conductive to form a floating gate and a control gate.

The step (a) may optionally include the steps of sequentially forming a tunnel oxide film, a first conductive layer, and a hard mask film on the semiconductor substrate; etching the hard mask film, the first conductive layer, and a predetermined region of the tunnel oxide film by photolithography and etch processes employing an isolation mask, thus forming a floating gate pattern, and then etching the semiconductor substrate at a predetermined depth to form a trench; forming an insulating film on the entire structure so that the trench is buried; and polishing the insulating film so that the hard mask film is exposed, and then stripping the hard mask film to form an isolation film.

The first conductive layer may preferably be formed to a thickness of 700 Å to 1500 Å by laminating an undoped polysilicon film and a doped polysilicon film. The undoped polysilicon film may preferably have a thickness which equals to half or less the thickness of the first conductive layer.

The step (b) may preferably be performed by a wet etch process employing buffered oxide etchant (BOE) or the like.

According to another aspect, the invention provides a method of manufacturing a flash memory device, including the steps of providing a semiconductor substrate in which a plurality of regions including a cell region and a high-voltage transistor region are defined; forming a tunnel oxide film and a gate oxide film having different thicknesses on the semiconductor substrate of the cell region and the high-voltage transistor region, respectively; forming a first conductive layer and a hard mask film on the entire structure, etching predetermined regions of the films formed in the cell region and the films formed in the high-voltage transistor region by means of a predetermined process, and then etching the semiconductor substrate at a predetermined depth, thereby forming a trench; forming an insulating film to bury the trench, polishing the insulating film, and stripping the hard mask film to form an isolation film; forming a mask that covers the high-voltage transistor region and opens the cell region, and then etching only the isolation film of the cell region at a predetermined thickness; stripping the mask and then etching the isolation film of the cell region and the high-voltage transistor region at a predetermined thickness; and sequentially forming a dielectric film and a second conductive layer on the entire structure, and patterning the second conductive to form a cell gate and a high voltage transistor gate.

The tunnel oxide film may preferably be formed to a thickness of 70 Å to 90 Å and the gate oxide film is preferably formed to a thickness of 350 Å to 400 Å.

The first conductive layer may preferably be formed to a thickness of 700 Å to 1500 Å by laminating an undoped polysilicon film and a doped polysilicon film. The undoped polysilicon film may preferably have the thickness which equals to half or less a thickness of the first conductive layer.

The isolation film of the cell region may preferably be etched by a wet etch process employing BOE or the like.

The isolation film of the cell region and the high-voltage transistor region may preferably be etched by a wet cleaning process performed after the mask is stripped.

According to another aspect, the invention provides a method of manufacturing a flash memory device, including the steps of providing a semiconductor substrate in which a plurality of regions including a cell region and a high-voltage transistor region are defined; etching the semiconductor substrate of the high-voltage transistor region at a predetermined thickness; performing an oxidization process to form a tunnel oxide film and a gate oxide film on the semiconductor substrate of the cell region and the high-voltage transistor region, respectively; forming a first conductive layer and a hard mask film on the entire structure, etching predetermined regions of the films formed in the cell region and the films formed in the high-voltage transistor region by means of a predetermined process, and then etching the semiconductor substrate at a predetermined depth, thereby forming a trench; forming an insulating film to bury the trench, polishing the insulating film, and stripping the hard mask film to form an isolation film; etching the isolation film of the cell region and the high-voltage transistor region at a predetermined thickness; and sequentially forming a dielectric film and a second conductive layer on the entire structure, and patterning the second conductive to form a cell gate and a high voltage transistor gate.

The semiconductor substrate of the high-voltage transistor region may preferably be etched taking a thickness of the tunnel oxide film and a thickness of the gate oxide film into consideration such that the tunnel oxide film and the gate oxide film have the same height from a surface of the semiconductor substrate.

The first conductive layer may be formed to a thickness of 700 Å to 1500 Å by laminating an undoped polysilicon film and a doped polysilicon film. The undoped polysilicon film may preferably have a thickness which is half or less the thickness of the first conductive layer.

The isolation film of the cell region and the high-voltage transistor region may preferably be etched by a wet etch process using BOE or the like.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The invention is described below in connection with certain exemplary embodiments with reference to the accompanying drawings.

FIGS. 1A to 1D are cross-sectional views illustrating a method of manufacturing a flash memory device according to a first embodiment of the invention.

Figure 1A:
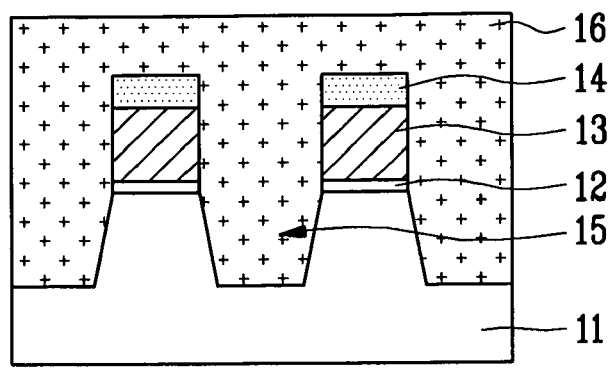
FIGS. 1A to 1D are cross-sectional views illustrating a method of manufacturing a flash memory device according to a first embodiment of the invention.

Referring to FIG. 1A, a tunnel oxide film 12, a first conductive layer 13, and a hard mask film 14 are sequentially formed on a semiconductor substrate 11. The first conductive layer 13 may preferably be formed to a thickness of 700 Å to 1500 Å by laminating an undoped polysilicon film and a doped polysilicon film in order to prevent warping of the tunnel oxide film 12. The undoped polysilicon film may be formed to have a thickness, which is half or less the total thickness of the first conductive layer 13. Meanwhile, the first conductive layer 13 may preferably be formed to a thickness of 1000 Å to 1500 Å when it is applied to single level cells and may preferably be formed to a thickness of 700 Å to 1000 Å when it is applied to multi-level cells. Furthermore, the hard mask film 14 may be formed using a nitride film.

The hard mask film 14 is patterned by photolithography and etch Processes using an isolation mask in order to define an active region and a field region. The first conductive layer 13, the tunnel oxide film 12, and the semiconductor substrate 11 are etched at a predetermined depth using the patterned hard mask film 14 as an etch mask, thereby forming a trench 15. Simultaneously with the formation of the trench 15, the first conductive layer 13 is patterned to define a floating gate pattern. That is, the trench for forming the isolation film and the floating gate pattern are defined in a parallel. Thereafter, an insulating film 16 is formed on the entire structure in order to bury the trench 15.

Figure 1B:
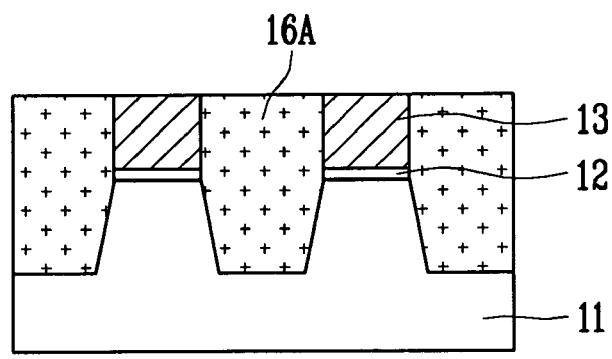

Referring to FIG. 1B, the insulating film 16 is polished to expose the hard mask film 14. The hard mask film 14 is then stripped using phosphoric acid or the like. As a result, an isolation film 16A in which the insulating film 16 is buried in the trench 15 is formed.

Figure 1C:
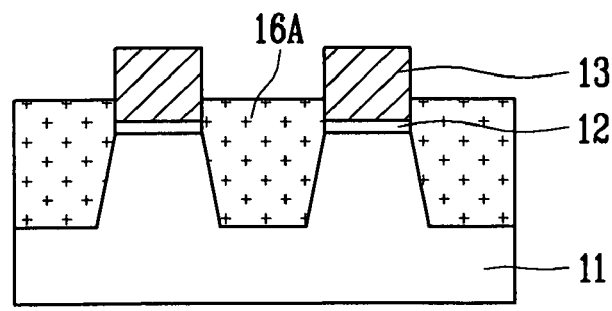

Referring to FIG. 1C, the isolation film 16A is etched at a predetermined depth by a wet etch process using BOE or the like in order to control the effective field height. If so, a contact area between a dielectric film to be formed later and the first conductive layer 13 is increased, leading to an increased coupling ratio.

Figure 1D:
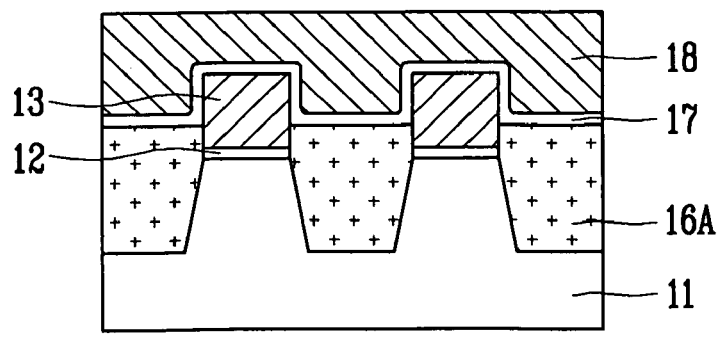

Referring to FIG. 1D, after a dielectric film 17 is formed on the entire structure, a second conductive layer 18 is formed on the dielectric film 17. A predetermined region from the second conductive layer 18 to the tunnel oxide film 12 is etched preferably by lithography and etch processes employing a control gate mask, thereby forming a gate in which the floating gate and the control gate are laminated. In this case, the first conductive layer 13 serves as a floating gate and the second conductive layer 18 serves as a control gate.

In the above-mentioned embodiment, only the process of the cell region has been described as an example. To increase the contact area between the dielectric film and the first conductive layer, not only the cell region, but also the isolation film of the peri region can be etched at a predetermined thickness. However, there is a limit to the increase of the contact area between the dielectric film and the first conductive layer because the etch process of the isolation film is performed in such a way not to damage the gate oxide film of the high-voltage transistor region, which is formed thicker than the tunnel oxide film of the cell region.

In view of the problem, another embodiment of the invention proposes a method capable of solving the problem in which the contact area between the dielectric film and the first conductive layer is limited due to the thickness of the gate oxide film of the high-voltage transistor region.

FIGS. 2A to 2E are cross-sectional views illustrating a method of manufacturing a flash memory device according to a second embodiment of the invention.

Figure 2A:
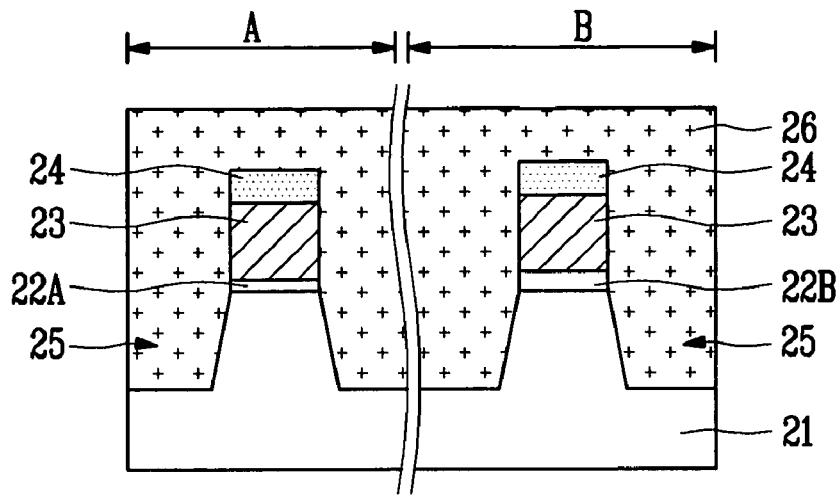
FIGS. 2A to 2E are cross-sectional views illustrating a method of manufacturing a flash memory device according to a second embodiment of the invention.

Referring to FIG. 2A, there is provided a semiconductor substrate 21 in which a cell region A, a high-voltage transistor region B, and the like are defined. A tunnel oxide film 22A is formed on the semiconductor substrate 21 of the cell region A. A gate oxide film 22B having a thickness thicker than that of the tunnel oxide film 22A is formed on the semiconductor substrate 21 of the high-voltage transistor region B. The tunnel oxide film 22A may preferably be formed to a thickness of 70 Å to 90 Å and the gate oxide film 22B may preferably be formed to a thickness of 350 Å to 400 Å.

A first conductive layer 23 and a hard mask film are formed on the entire structure 24. The first conductive layer 23 may preferably be formed to a thickness of 700 Å to 1400 Å by laminating an undoped polysilicon film and a doped polysilicon film. The undoped polysilicon film may be formed to have a thickness, which is preferably half or less a total thickness of the first conductive layer 23. Meanwhile, the first conductive layer 23 may preferably be formed to a thickness of 1000 Å to 1500 Å when it is applied to single level cells and may preferably be formed to a thickness of 700 Å to 1000 Å when it is applied to multi-level cells.

Furthermore, the hard mask film 24 may be formed using a nitride film. The hard mask film 24 is patterned by photolithography and etch processes using an isolation mask in order to define an active region and a field region. The first conductive layer 23, the tunnel oxide film 22A, and the semiconductor substrate 21 are etched at a predetermined depth using the patterned hard mask film 24 as an etch mask, thereby forming a trench 25. In this case, the trench 25 is also formed in the high-voltage transistor region B by the same process. An insulating film 26 is formed on the entire structure so that the trench 25 is buried.

Figure 2B:
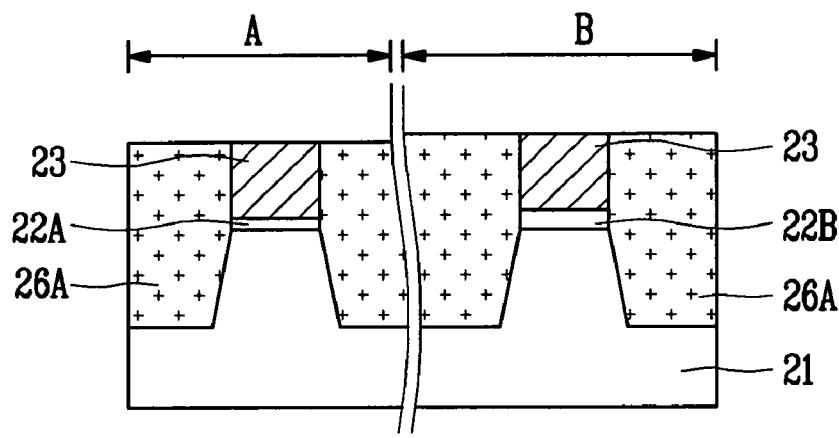

Referring to FIG. 2B, the insulating film 26 is polished to expose the hard mask film 24. The hard mask film 24 is then stripped using phosphoric acid or the like. As a result, an isolation film 26A in which the insulating film 26 is buried in the trench 25 is formed.

Figure 2C:
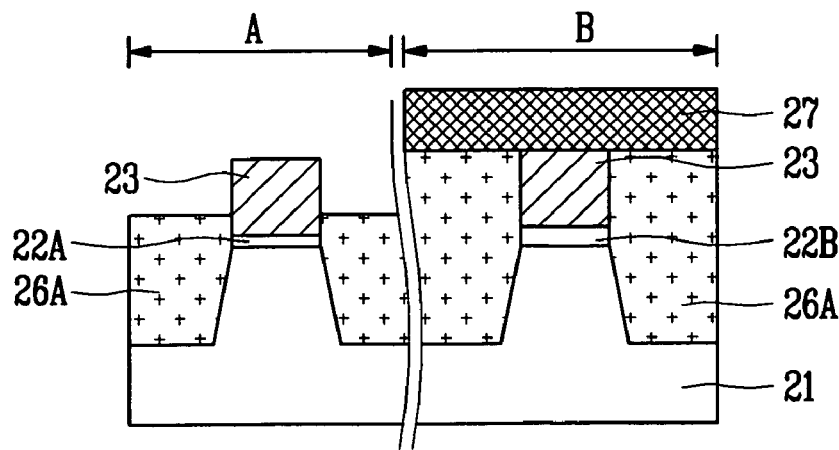

Referring to FIG. 2C, after a photoresist film 27 is formed on the entire structure, the photoresist film 27 is patterned so that it remains only in the high-voltage transistor region B. In a state where the photoresist film 27 remains only in the high-voltage transistor region B, the isolation film 26A of the cell region A is etched at a predetermined depth preferably by a wet etch process using BOE or the like in order to control the EFH.

Figure 2D:
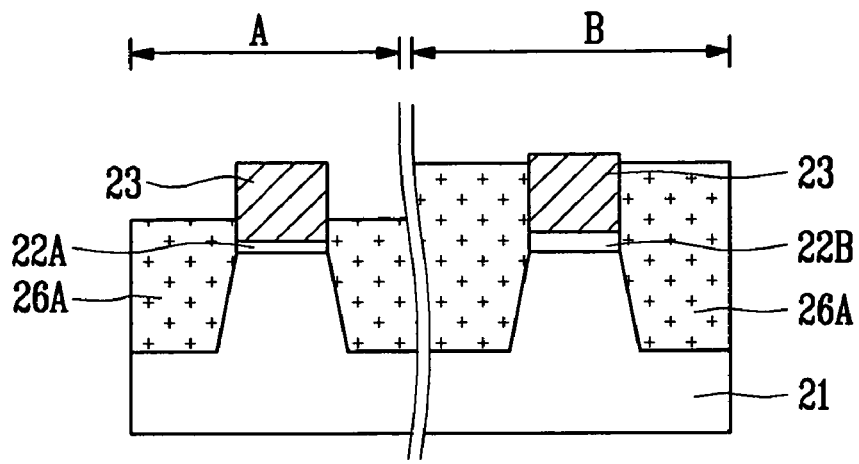

Referring to FIG. 2D, after the photoresist film 27 formed in the high-voltage transistor region B is stripped, a cleaning process is performed. The isolation films 26A of the cell region A and the high-voltage transistor region B are etched at a predetermined thickness by means of the cleaning process and the thickness of the isolation film 26A, which is etched by the cleaning process, is set to the final EFH. At this time, it is preferred that the etch thickness of the isolation film 26A is controlled such that the tunnel oxide film 22A of the cell region A is not exposed.

Figure 2E:
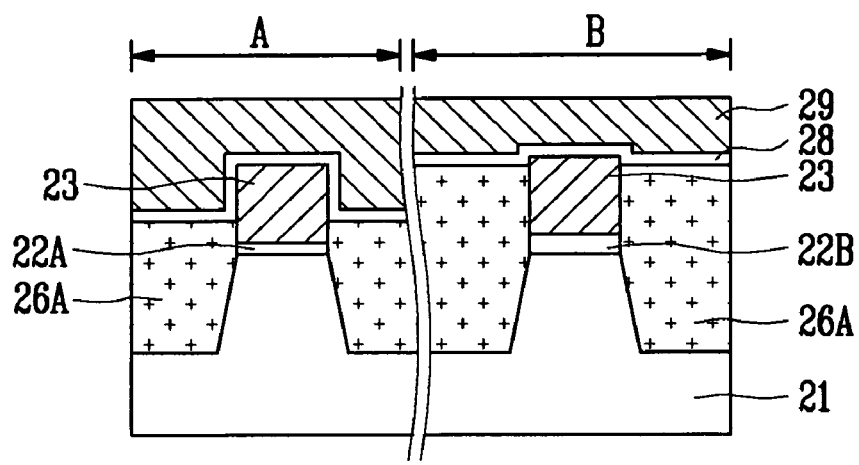

Referring to FIG. 2E, after a dielectric film 28 is formed on the entire structure, a second conductive layer 29 is formed on the dielectric film 28. A predetermined region from the second conductive layer 28 to the gate oxide film 22B, of the high-voltage transistor region B, and a predetermined region from the second conductive layer 28 to the tunnel oxide film 22A, of the cell region A, are etched at the same time by means of a lithography process and an etch process employing the control gate mask. Accordingly, a cell gate and a high-voltage transistor gate in which the floating gate and the control gate are laminated are formed.

FIGS. 3A to 3E are cross-sectional views illustrating a method of manufacturing a flash memory device according to a third embodiment of the invention.

Figure 3A:
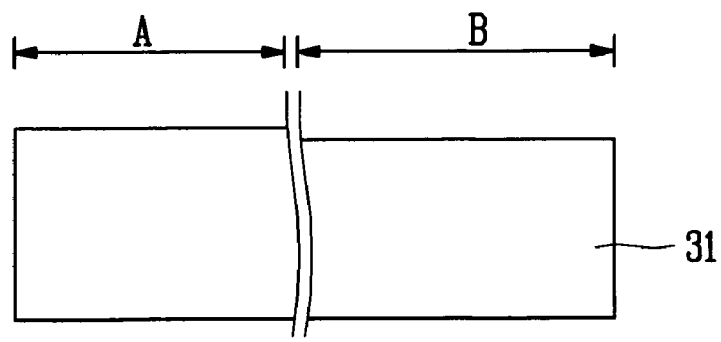
FIGS. 3A to 3E are cross-sectional views illustrating a method of manufacturing a flash memory device according to a third embodiment of the invention.

Referring to FIG. 3A, there is provided a semiconductor substrate 31 in which a cell region A and a high-voltage transistor region B are defined. The semiconductor substrate 31 of the high-voltage transistor region B is etched at a predetermined depth. In this case, the etch depth of the semiconductor substrate 31 is decided taking a thickness of a tunnel oxide film formed in the cell region A and a thickness of a gate oxide film formed in the high-voltage transistor region B into consideration. For example, in the case where the tunnel oxide film is preferably formed to a thickness of 70 Å to 90 Å in the cell region A and the gate oxide film is preferably formed to a thickness of 350 Å to 400 Å in the high-voltage transistor region, the semiconductor substrate 31 may be etched to a depth of 260 Å to 330 Å, for example.

Figure 3B:
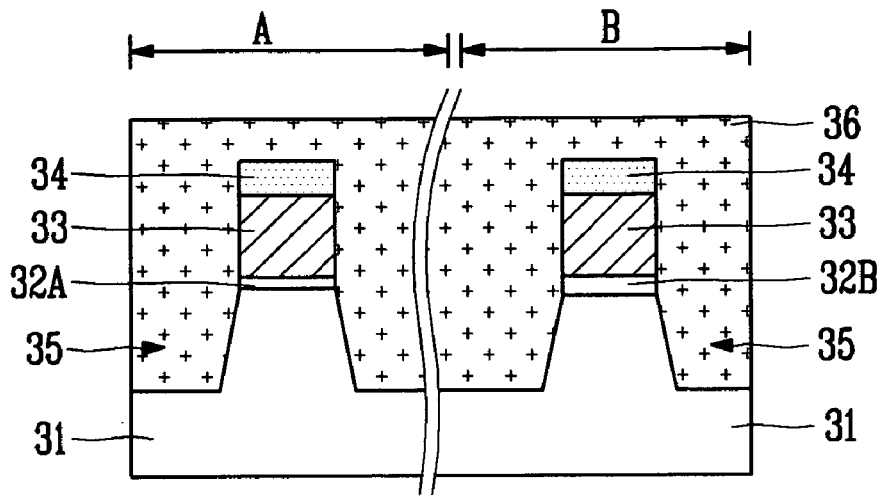

Referring to FIG. 3B, an oxidization process is performed to form a tunnel oxide film 32A on the semiconductor substrate 31 of the cell region A and a gate oxide film 32B on the semiconductor substrate 31 of the high-voltage transistor region B. At this time, the oxidization process is carried out with the semiconductor substrate 31 of the high-voltage transistor region B being etched. Accordingly, the tunnel oxide film 32A of the cell region A and the gate oxide film 32B of the high-voltage transistor region B are formed to have the same height from the surface of the semiconductor substrate 31. Accordingly, there is no step between the cell region A and the high-voltage transistor region B.

A first conductive layer 33 and a hard mask film 34 are sequentially formed on the entire structure. The first conductive layer 33 is preferably formed to a thickness of 700 Å to 1500 Å by laminating an undoped polysilicon film and a doped polysilicon film. The undoped polysilicon film may be formed to have a thickness, which is preferably half or less the total thickness of the first conductive layer 33. Meanwhile, the first conductive layer 33 may preferably be formed to a thickness of 1000 Å to 1500 Å when it is applied to single level cells and may preferably be formed to a thickness of 700 Å to 1000 Å when it is applied to multi-level cells.

Furthermore, the hard mask film 34 may be formed using a nitride film. The hard mask film 34 is patterned by photolithography and etch processes using an isolation mask in order to define an active region and a field region. The first conductive layer 33, the tunnel oxide film 32A, and the semiconductor substrate 31 are etched at a predetermined depth using the patterned hard mask film 34 as an etch mask, thereby forming a trench 35. In this case, the trench 35 is also formed in the high-voltage transistor region B by means of the same process. An insulating film 36 is formed on the entire structure so that the trench 35 is buried.

Figure 3C:
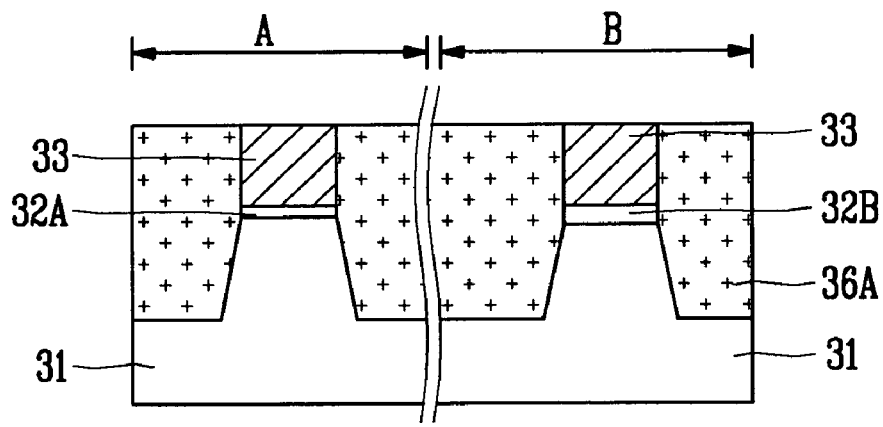

Referring to FIG. 3C, the insulating film 36 is polished to expose the hard mask film 34. The hard mask film 34 is then stripped using phosphoric acid or the like. As a result, an isolation film 36A in which the insulating film 36 is buried in the trench 35 is formed.

Figure 3D:
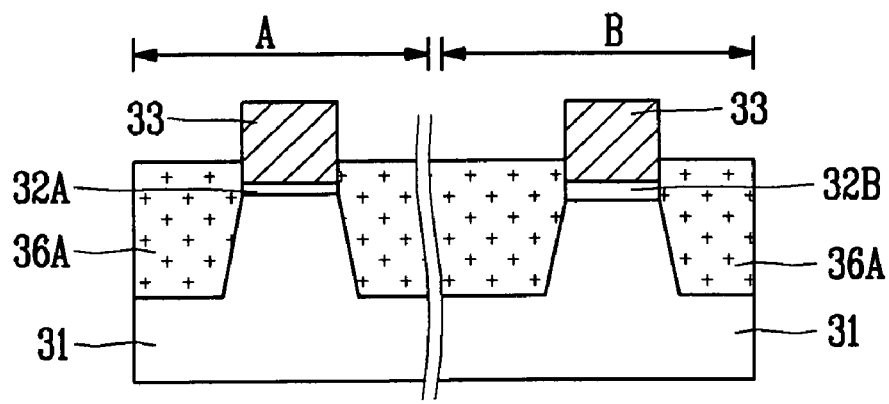

Referring to FIG. 3D, the isolation films 36A of the cell region A and the high-voltage transistor region B are etched at a predetermined depth, preferably by means of a wet etch process using BOE or the like in order to control the EFH.

Figure 3E:
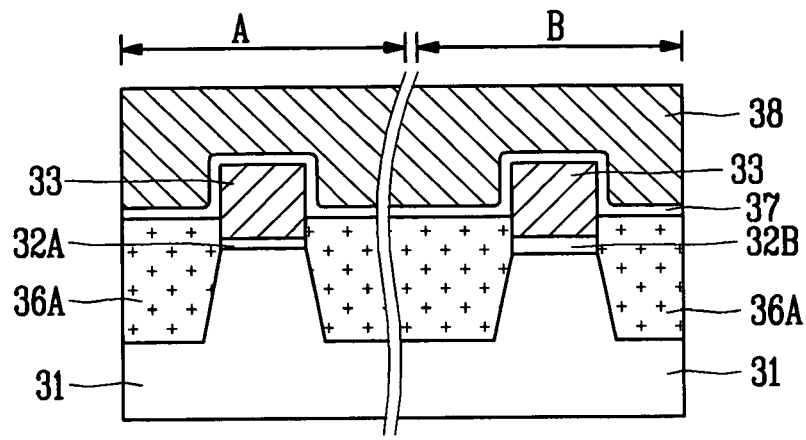

Referring to FIG. 3E, after a dielectric film 37 is formed on the entire structure, a second conductive layer 38 is formed on the dielectric film 37. A predetermined region from the second conductive layer 38 to the gate oxide film 32B, of the high-voltage transistor region B, and a predetermined region from the second conductive layer 38 to the tunnel oxide film 32A, of the cell region A, are etched at the same time by means of a lithography process and an etch process employing the control gate mask. Accordingly, a cell gate and a high-voltage transistor gate in which the floating gate and the control gate are laminated are formed.

In the above-mentioned embodiment, since the first conductive layer, the tunnel oxide film, and the semiconductor substrate have been aligned, the tunnel oxide film and the semiconductor substrate may be damaged in the process of etching the isolation film in order to control the EFH. Furthermore, the first conductive layer may also be damaged since the isolation film is etched with the side of the first conductive layer being exposed. Accordingly, the problem can be prevented by further etching the isolation film after conductive layer spacers are formed on the sidewalls of the first conductive layer. This will be described below with reference to FIGS. 4A to 4E.

FIGS. 4A to 4E are cross-sectional views illustrating a method of manufacturing a flash memory device according to a fourth embodiment of the invention.

Figure 4A:
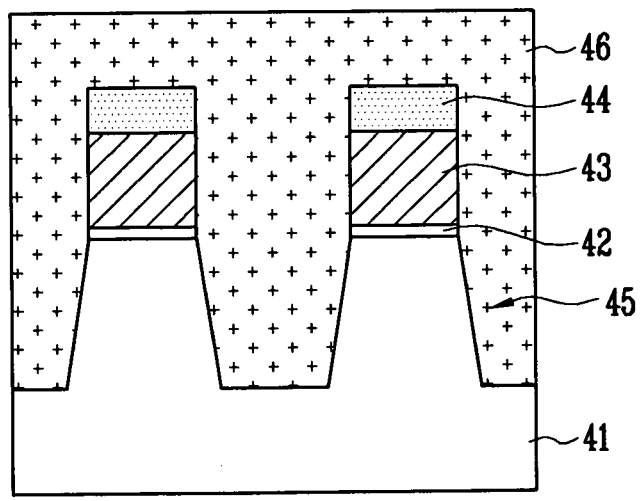
FIGS. 4A to 4E are cross-sectional views illustrating a method of manufacturing a flash memory device according to a fourth embodiment of the invention.

Referring to FIG. 4A, a tunnel oxide film 42, a first conductive layer 43, and a hard mask film 44 are sequentially formed on a semiconductor substrate 41. The first conductive layer 43 is preferably formed to a thickness of 700 Å to 1500 Å using an undoped polysilicon film. The first conductive layer 43 may preferably be formed to a thickness of 1000 Å to 1500 Å when it is applied to single level cells and may preferably be formed to a thickness of 700 to 1000 Å when it is applied to multi level cells. Furthermore, the hard mask film 44 may be formed using a nitride film.

The hard mask film 44 is patterned by a lithography process and an etch process employing an isolation mask in order to define an active region and a field region. The first conductive layer 43, the tunnel oxide film 42, and the semiconductor substrate 41 are etched at a predetermined depth using the patterned hard mask film 44 as an etch mask, thus forming a trench 45. Simultaneously with the formation of the trench 45, the first conductive layer 43 is patterned to define a floating gate pattern. That is, the trench for forming the isolation film and the floating gate pattern are defined in parallel. An insulating film 46 is formed on the entire structure so that the trench 45 is buried.

Figure 4B:
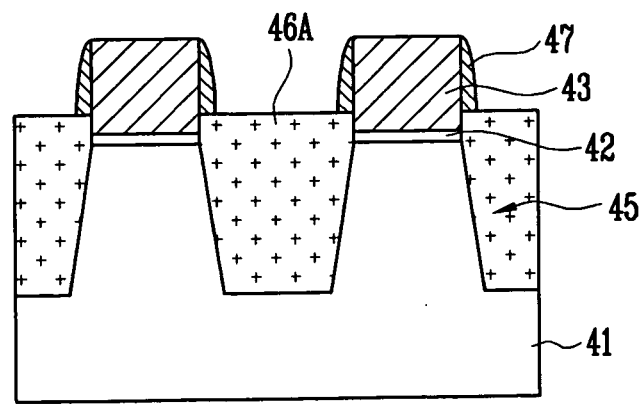

Referring to FIG. 4B, after the insulating film 46 is polished to expose the hard mask film 44, the hard mask film 44 is stripped using phosphoric acid or the like. Accordingly, an isolation film 46A in which the insulating film 46 is buried in the trench 45 is formed. The isolation film 46A is then etched at a predetermined depth by means of a wet etch process using BOE or the like in order to control the EFH.

Figure 4C:
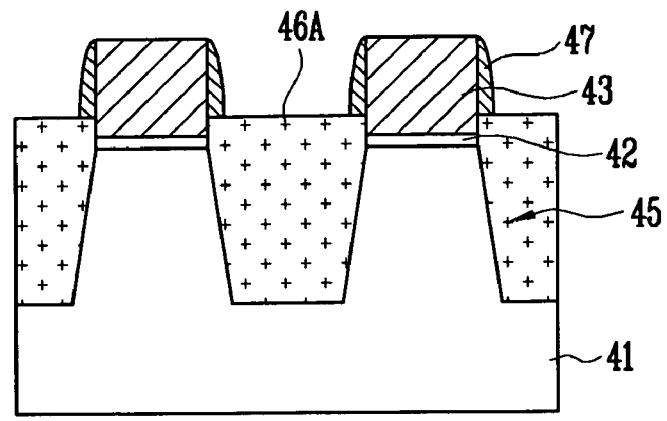

Referring to FIG. 4C, after a conductive layer is formed on the entire structure, the conductive layer is blanket etched to form conductive layer spacers 47 on the sidewalls of the first conductive layer 43. The conductive layer spacers 47 are formed to a minimal thickness that will not have an effect on an interference phenomenon between neighboring cells. The conductive layer spacers 47 may be formed using a doped polysilicon film. It is preferred that the conductive layer spacers 47 are formed to a thickness, which is preferably up to half the distance between cells, and are formed to have a doping concentration of 1E15 ions/cm$^2$ to 2E15 ions/cm$^2$, although the doping concentration can be more than 2E15 ions/cm$^2$.

Figure 4D:
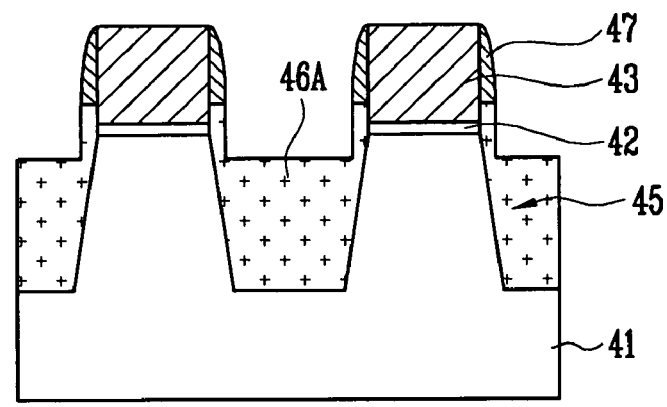

Referring to FIG. 4D, in a state where the conductive layer spacers 47 are formed on the sidewalls of the first conductive layer 43, a cleaning process is performed to further etch the isolation film 46A.

Figure 4E:
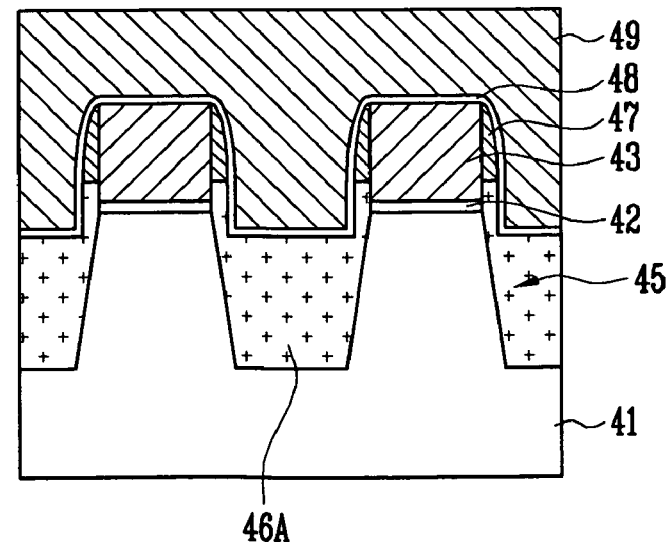

Referring to FIG. 4E, after a dielectric film 48 is formed on the entire structure, a second conductive layer 49 is formed. A predetermined region from the second conductive layer 49 to the tunnel oxide film 42 is etched by a lithography process and an etch process employing the control gate mask, thereby forming a cell gate in which the floating gate and the control gate are laminated.

As described above, according to the invention, the floating gate can be formed and the distance between cells can be secured sufficiently by using one conductive layer without using the SA-STI process that cannot be applied to the manufacture process of high-integrated semiconductor devices. It is therefore possible to minimize an interference phenomenon between neighboring cells. Furthermore, the EFH can be controlled by etching the isolation film of the cell region at a predetermined thickness. It is therefore possible to increase the contact area between the dielectric film and the floating gate and also to improve the coupling ratio.

Furthermore, an isolation film is etched after a photoresist film covering only a high-voltage transistor region is formed, or a gate oxide film is formed after a semiconductor substrate is etched at a thickness, which is the same as that of the gate oxide film of the high-voltage transistor region, so that a step between the cell region and the high-voltage transistor region is the same. Accordingly, the coupling ratio can be increased even by the gate oxide film of the high-voltage transistor region, which is thicker than the tunnel oxide film of the cell region.

In addition, damage to a tunnel oxide film, a semiconductor substrate or a floating gate while an isolation film is etched at a predetermined depth in order to control the EFH can be prevented by controlling the EFH in such a manner than conductive layer spacers are formed on sidewalls of the floating gate and the isolation film is further etched.

While the invention has been described in connection with practical exemplary embodiments, the invention is not limited to the disclosed embodiments but, to the contrary, is intended to cover various modifications and equivalent arrangements included within the spirit and scope of the appended claims.

What is claimed is:

1. A method of manufacturing a flash memory device, comprising:
   providing a semiconductor substrate in which a plurality of regions including a cell region and a high-voltage transistor region are defined;
   etching a surface of the semiconductor substrate of the high-voltage transistor region so that a height of the cell region of the semiconductor substrate is higher than that of the high-voltage transistor region;

forming a tunnel oxide film on a non-etched semiconductor substrate of the cell region;

forming a single gate oxide film on the etched semiconductor substrate of the high-voltage transistor region;

forming a first conductive layer and a hard mask film over the tunnel oxide film and the gate oxide film;

etching the hard mask film, the first conductive layer, and the semiconductor substrate to form a trench;

filling the trench with an insulating film to form an isolation film;

etching an upper portion of the isolation film formed in the cell region and the high-voltage transistor region; and forming a dielectric film and a second conductive layer on the first conductive layer; and patterning the second conductive layer to form a cell gate and a high-voltage transistor gate, wherein the tunnel oxide film and the single gate oxide film are formed by performing oxidization.

2. The method of claim 1, comprising etching the semiconductor substrate of the high-voltage transistor region taking a thickness of the tunnel oxide film and a thickness of the single gate oxide film into consideration such that the tunnel oxide film and the single gate oxide film have the same height from the surface of the semiconductor substrate.

3. The method of claim 1, comprising forming the first conductive layer to a thickness of 700 Å to 1500 Å by laminating an undoped polysilicon film and a doped polysilicon film.

4. The method of claim 3, wherein the undoped polysilicon film has a thickness, which is half or less a thickness of the first conductive layer.

5. The method of claim 1, comprising etching the isolation film of the cell region and the high-voltage transistor region by a wet etch process using buffered oxide etchant (BOE).

* * * * *